US006707300B2

United States Patent
Polzin et al.

(10) Patent No.: US 6,707,300 B2
(45) Date of Patent: Mar. 16, 2004

(54) GRADIENT NON-LINEARITY COMPENSATION IN MOVING TABLE MRI

(75) Inventors: Jason A. Polzin, Lake Mills, WI (US); Stephen J. Riederer, Rochester, MN (US); David G. Kruger, Nelson, WI (US)

(73) Assignees: GE Medical Systems Global Technology Co., LLC, Waukesha, WI (US); Mayo Clinic, Rochester, MN (US)

(*) Notice: Subject to any disclaimer, the term of this patent is extended or adjusted under 35 U.S.C. 154(b) by 123 days.

(21) Appl. No.: 10/147,701

(22) Filed: May 17, 2002

(65) Prior Publication Data

US 2003/0214295 A1 Nov. 20, 2003

(51) Int. Cl.⁷ .................................................. G01V 3/00
(52) U.S. Cl. ........................................ 324/309; 324/307
(58) Field of Search ................................ 324/309, 307, 324/306, 312, 314, 318, 322, 300

(56) References Cited

U.S. PATENT DOCUMENTS

| | | | |
|---|---|---|---|
| 4,591,789 A | | 5/1986 | Glover et al. |
| 5,200,700 A | * | 4/1993 | Glover et al. ................ 324/309 |
| 5,910,728 A | * | 6/1999 | Sodickson ................... 324/309 |
| 5,928,148 A | | 7/1999 | Wang et al. |
| 6,249,694 B1 | * | 6/2001 | Foo et al. .................... 600/420 |
| 6,317,620 B1 | | 11/2001 | Ho et al. |

FOREIGN PATENT DOCUMENTS

| | | |
|---|---|---|
| JP | H6-304153 | 11/1994 |
| JP | H6-311977 | 11/1994 |
| JP | H8-173396 | 7/1996 |

OTHER PUBLICATIONS

Moran, PR. A flow velocity zeugmatographic interface for NMR imaging in humans, Magnetic Resonance Imaging 1982; 1: 197–203.

Bryant DJ, Payne JA, Firmin DN, and Longmore DB. Measurement of flow with NMR imaging using a gradient pulse and phase difference technique. J Comput Assist Tomogr 1984; 8: 588–93.

Van Dijk P. Direct cardiact NMR imaging of heart wall and blood flow velocity. J. Comput Assist Tomogr 1984; 8: 429–36.

(List continued on next page.)

Primary Examiner—Louis Arana
(74) Attorney, Agent, or Firm—Ziolkowski Patent Solutions Group, LLC; Michael A. Della Penna; Carl B. Horton

(57) ABSTRACT

The present invention includes a method and apparatus to correct for gradient field distortions. The invention is particularly applicable in moving table imaging where a single extended image is desirable. The invention includes acquiring MR data in motion in the presence of gradient non-linearities, transforming the MR data acquired into the image domain, and then applying a warping correction function to the transformed MR data. The warp-corrected MR data is then corrected for motion induced during the MR acquisition. The data may be acquired point-by-point, line-by-line, or another sub-portion of the entire MR data acquired, and processed to minimize the amount of motion correction needed. Based on table velocity or acquisition sequence applied, the data is partitioned based on a common motion correction factor, and after correcting for motion, the data is accumulated to build up a final image.

35 Claims, 5 Drawing Sheets

OTHER PUBLICATIONS

Nayler GL, Firmin DN, and Longmore DB, Blood Flow imaging by cine magnetic resonance. J Comput Assist Tomogr 1986; 10: 715–22.

Swan JS, Grist TM, Weber DM, Sproat IA, and Wojtowycz MM. MR angiography of the pelvis with variable velocity encoding and a phase–array coil. *Radiology* 1994; 190: 363–9.

Swan Js, Weber Dm, Grist TM, Wojtowycz MM, Korosec FR, and Mistretta CA. Peripheral MR angiography with variable velocity encoding. Work in progress, *Radiology* 1992; 813–7.

Ehman RL, Felmlee JP. Adaptive technique for high definition MR imaging of moving structures. *Radiology* 1998; 173: 255–263.

Ho KY, Leiner T, de Haan MW, Kessels AG, Kitslaar PF, and van Engelshoven JM. Peripheral vasculature tree stenoses: evaluation with moving–bed infusion–tracking MR angiography. *Radiology* 1998; 260: 683–92.

Meaney JF, Ridgway JP, Chakraverty S, Robertson I, Kessel D, Radienovic A, Kouwenhoven M, Kassner A, and Smith MA. Stepping–table gadolinium–enhanced digital subtraction MR angiography of the aorta and lower extremity arteries; preliminary experience, *Radiology* 1999; 211: 59–67.

Foo, TKF, Saranathan M. Prince MR, and Chenevert TL. Automated detection of bolus arrival and initiation of data acquisition in fast, three–dimensional, gadolinium–enhanced MR angiography. *Radiology* 1997; 203: 275–80.

Wilman AH, Riederer SJ, Huston J. $3^{rd}$, Wald JT, and Debbins JP. Arterial phase carotid and vertebral artery imaging in 3D contrast–enhanced MR angiography by combining fluoroscopic triggering with an elliptical centric acquisition order. *Magn. Reson Med.* 1998; 40: 24–35.

Riederer SJ, Fain SB, Kruger DG, and Busse RF. 3D–enhanced MR angiography using fluoroscopic triggering and an elliptical centric view order. *Int. J. Card Imaging* 1999; 15: 117–29.

Prince MR, Chenevert TL, Foo TKF, Londy FJ, Ward JS, Maki JH. Contrast enhanced abdominal MR angiography; Optimization of imaging delay time by automating the detection of contrast material arrival in the aorta. *Radiology* 1997; 203: 109–114.

Meany, Dr. James FM, Leeds General Infirmary, Leeds UK Moving Bed MRA, The Future of Peripheral Arteriography? *Phillips.*

Kouwenhoven, M., MRA with moving bed imaging, IX International Workshop on Magnetic Resonance Angiography and introductory Course "New Horizons on MRA and CTA", Valencia, Oct. 7–11, 1997, Book of Abstracts, *The MR Angio Club*, p. 158.

Kruger, DG., Riederer, S.J., Grimm, R.C., Rossman, P.J., Continuously moving table data acquisition method for long FOV contrast–enhanced MRA and whole–body MRI. Magnetic Resonance in Medicine, 47: 224–231 (2002).

K. Liu, B. Rutt, "Sliding Interleaved ky (Slinky) Acquisition: A Novel 3D MRA Technique with Suppressed Slab Boundary Artifact", JMRI, 8: 903–911 (1998).

K. Liu, B. Rutt, "Systemic Assessment and Evaluation of Sliding Interleaved ky (SLINKY) Acquisition for 3D MRA", JMRI, 8: 912–923 (1998).

K. Liu, "Slinky: More Understanding, Optimization and Application for High Resolution MRA", ISMRM Seventh Scientific Meeting, 1908, 1999.

K. Liu, Y. Xu, M. Loncar, A Artifact Transformation Technique: Shifted Interleaved Multi–Volume Acquisition (SIMVA) for 3D FSE, ISMRM Sixth Scientific Meeting 1618, 1999.

K, Liu, Y. Xu, M. Loncar "Applications of Shifted–Interleaved Multi–Volume Acquisition (SIMVA) with Suppressed Slab Boundary Artififact", ISMRM Seventh Scientific Meeting, 1618, 1999.

J. Hennig, "Overlapping Section Coverage in Multisection Imaging", JMRI, 3:425–432 (1993).

J. Pipe, "Spatial Encoding and Reconstruction in MRI with Quadratic Phase Profiles", MRM, 33:24–33 (1995).

J. Pipe, "Analysis of Localized Quadratic Encoding and Reconstruction", MRM, 36: 137–146 (1996).

O'Dietrich, J. Hajnal, "Extending the Coverage of True Volume Scans by Continuous Movement of the Subject", ISMRMSevemtj Scoemtofoc <eetomg. 1653, 1999.

K.Y. Ho, T. Leiner, M.H. de haan, J.M. A. van Engelshoven, "Gadolinium Optimized Tracking Technique: A new MRA technique for Imaging the Peripheral Vascular Tree from Aorta to the Foot using one Bolus of Gadolinium", ISMRM Fifth Scientific Meeting, 203, 1997.

\* cited by examiner

GRADIENT NON-LINEARITY COMPENSATION IN MOVING TABLE MRI

BACKGROUND OF THE INVENTION

The present invention relates generally to magnetic resonance imaging (MRI), and more particularly to a method and apparatus to correct gradient field distortion where an object moves with respect to the gradient non-linearities.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

In MR imaging, magnetic field gradients are used to spatially encode objects. A magnetic field gradient is a linear variation along any of the principal directions of the $B_z$ field. Non-linearities of the magnetic field gradient cause geometric distortion or "warping" of the resulting image.

It is highly desirable to extend the available imaging field-of-view (FOV) images by continuous or stepped table motion. These techniques attempt to image in the region where the gradients are mostly linear to minimize errors caused by gradient non-linearities. Such errors result in ghosting and/or blurring of the resulting images. The principal goal of acquiring images while the table is moving is to extend the usable imaging FOV beyond that which is normally achievable. However, to date the issue of correcting for gradient distortion in the presence of continuous or stepped table motion has not been adequately resolved. Previous approaches have focused on imaging over a relatively narrow region of the gradient coil where the gradients are substantially linear, thereby reducing the need for correction. However, by increasing the imaging volume to include regions of gradient non-linearity, the acquisition time for these types of scans can be greatly reduced.

In moving table imaging, the subject passes through different physical locations in the magnet during acquisition. Therefore, the subject experiences different amounts of gradient non-linearity as the subject moves from iso-center to the periphery of the gradient field. Thus, the subject is encoded with different positional errors during movement through the magnetic field. These errors can cause blurring and ghosting in the resulting images in addition to geometric distortion. That is, if the table is moving continuously during data acquisition, then each point in k-space is acquired at a different location in the sample being image. This means that each point in the subject experiences different gradient fields over the course of the data acquisition and a correspondingly different amount of distortion.

For the special case of frequency encoding along the direction of motion each phase-encoding step is acquired at a different table position corresponding to a different location in the object being imaged. In this technique, the data is first Fourier transformed along the frequency-encoding direction resulting in hybrid data. Each phase-encoding in this hybrid data can then be registered by calculating the pixel offset from the pulse sequence repetition time (TR) and the table velocity (v) and applying the appropriate shift. Further Fourier transform(s), the number of which is based on whether a 2D or 3D image is being reconstructed, can then be performed on the entire hybrid data set after the appropriate shifts have been applied to each of the phase-encodings. While this technique has proven to provide adequate images in many applications, it could be improved by opening up the FOV to include regions of increased gradient non-linearity and/or could benefit from higher quality images if a gradient non-linearity correction were employed.

It would therefore be desirable to have a method and apparatus to compensate for gradient non-linearity where the gradients vary. A specific implementation of which is moving table imaging.

BRIEF DESCRIPTION OF THE INVENTION

The present invention relates to a system and method of compensating for gradient field non-linearities to allow large FOV MR imaging using continuous or stepped table motion.

Ideally, in conventional imaging, data is acquired in the presence of linear gradients. However, any deviation from this ideal linearity can cause errors in the final image. That is, it is assumed that the field strength is directly proportional to the distance from the magnet iso-center along the gradient direction. Any variation from this linearity introduces an error such that the resulting image is distorted. Given knowledge of the error in the gradient field, or the deviation from linearity, an approximation of the ideal image can be calculated. The present invention includes a method and apparatus to correct for gradient field distortions. The invention is particularly applicable in moving table imaging where a single extended image or a series of smaller images comprising a larger FOV is desirable. The invention includes acquiring MR data in motion in the presence of gradient non-linearities, transforming the MR data acquired into the image domain, and then applying a warping correction function to the transformed MR data. The warp-corrected MR data is then corrected for motion induced during the MR acquisition. The data may be processed point-by-point, line-by-line, or some other sub-portion of the entire MR data acquired, and processed to minimize the amount of motion correction needed. Based on table velocity or acquisition sequence applied, the data is partitioned based on a common motion correction factor, and after correcting for motion, the data is accumulated to build up a final image.

In the present technique, each data set is corrected separately for gradient distortion by first converting it to an image. To place the data in the image domain, the data is first Fourier transformed, preferably along the frequency encoding direction. In moving table MRI, the frequency encoding direction is preferably along the direction of table motion. Additionally, a second Fourier transform, or a second and third in the case of 3D imaging, is also done for each phase-encoding point or line. This can be done either by applying a Fourier transform to a matrix having the current phase-encoding data therein and the remainder filled with zeros or using the basis that phase-encoding step is a delta function along the phase-encoding direction that corresponds to a unique phase modulation. The resulting image can then be corrected for gradient distortion using predetermined gradient error maps. After correction, the data is shifted by a motion offset and added to the previous data. This process is repeated for each encoded data and across all acquisitions until the final FOV image is built up.

In accordance with one aspect of the invention, a method of correcting gradient non-linearities in MR imaging is disclosed that includes acquiring MR data in motion, which include acquisition at different positions, in the presence of gradient non-linearities, and after transforming the MR data acquired into an image domain, applying a warping correction to the transformed MR data. The warp-corrected MR data is then corrected for the motion that occurred during MR data acquisition.

In accordance with another aspect of the invention, a method of correcting gradient non-linearities in moving table MR imaging is disclosed that includes translating a patient on a movable table within a magnet and acquiring MR data that is acquired in the presence of gradient non-linearities. The method also includes reconstructing the MR data point-by-point into an image, correcting any warping in the portion of the MR data that is acquired in the presence of the gradient non-linearities while in an image domain and shifting the MR data acquired to compensate for table motion.

In accordance with another aspect of the invention, the apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. A movable table is also provided to translate an imaging object about the magnet and a computer is programmed to translate the movable table through the bore of the magnet and acquire MR data of any imaging object positioned on the table as the movable table is translated through the bore of the magnet. The computer is also programmed to further process the MR data acquired by one of a point-by-point or line-by-line basis and perform a 1-D Fourier Transform (FT) on the MR data in a direction of table motion. The computer then performs additional FTs on the MR data, depending on whether a 2D or 3D image is being acquired, and then apply a gradient non-linearity correction (GradWarp) function on the MR data. The image space is then filled with the MR data corrected for gradient non-linearities.

In accordance with yet another aspect of the invention, a computer program is disclosed for compensating gradient non-linearities in moving table MRI. The computer program is stored on a computer readable storage medium and includes a set of instructions which, when executed, cause the computer to move a patient table with respect to a gradient coil, acquire a plurality of MR data points, and perform a 1-D FFT to each MR data point. The computer program also causes the computer to place at least one MR data point into a matrix that is sized based on a desired image dimension sought and to fill a remainder of the matrix with zeros. The desired image dimensions sought could be a 2D or 3D image. Another FFT is then performed, the type of which is dependent on the desired image sought and then a GradWarp function is applied to the MR data points. Each MR data point is then corrected for patient table motion and added to build up an image.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
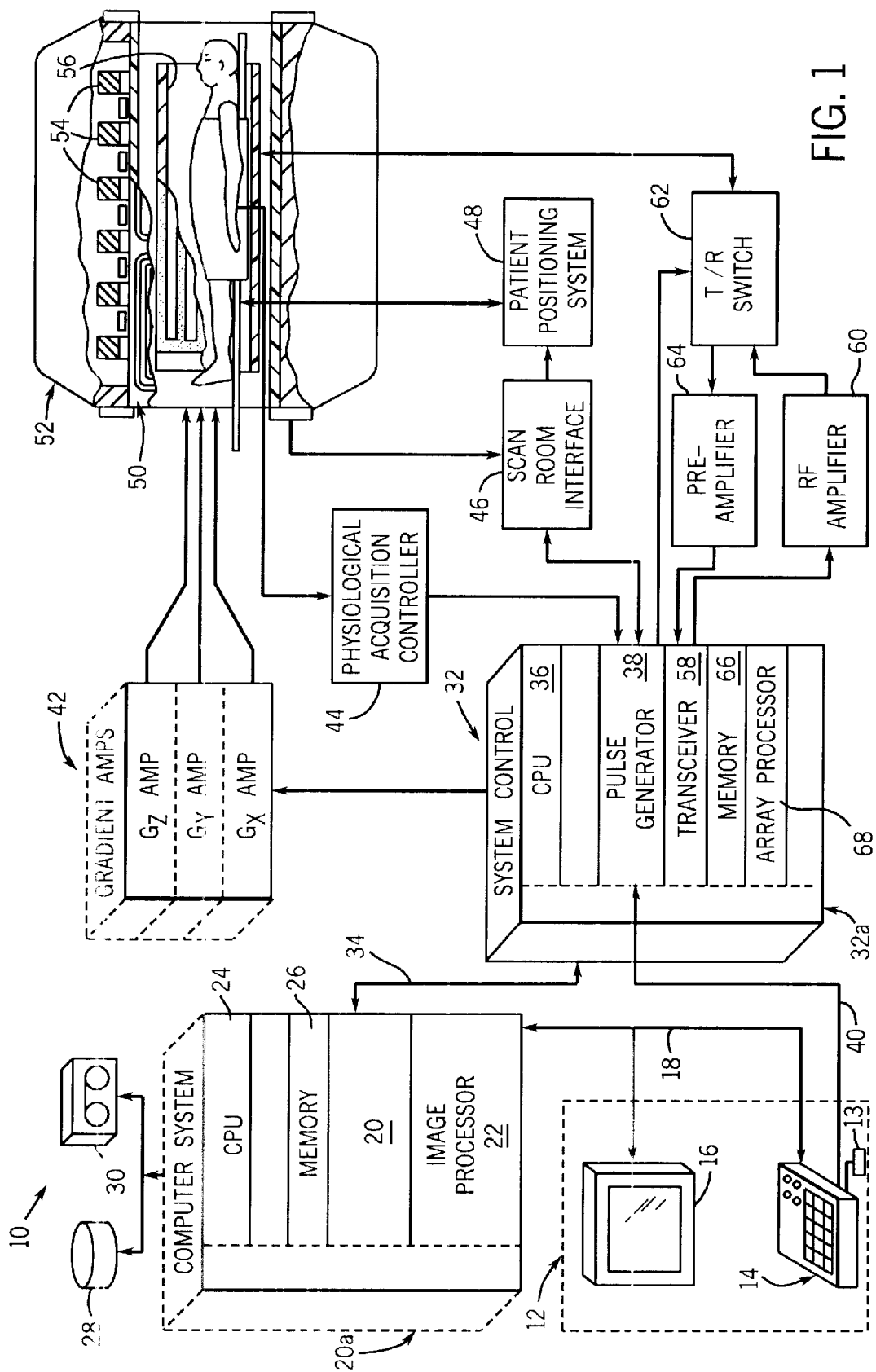
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention includes a method and system for correcting gradient non-linearity in MR image data for use with the above-reference MRI system, or any similar equivalent system for obtaining MR images preferably with a moving table.

Figure 2:
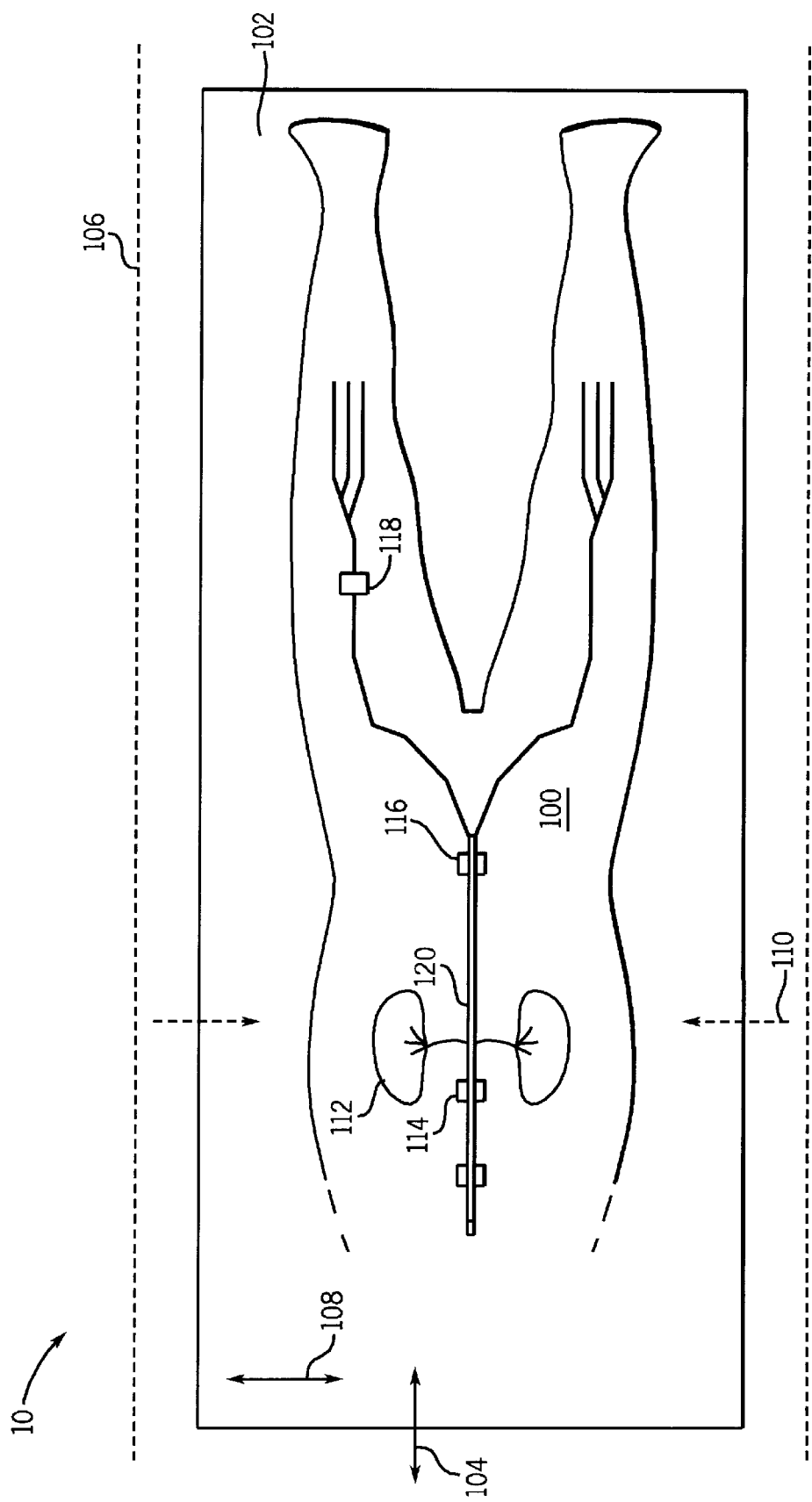
FIG. 2 is an enlarged top planar view of the patient table of FIG. 1 with depiction of a patient thereon and being movable under computer control in accordance with the present invention.

Referring to FIG. 2, a patient 100 is shown supported on a computer controlled, movable table 102 which is controlled by CPU 36 of system control 32 of FIG. 1. The movable table 102 may be moved or translated fore and aft as indicated by arrow 104 through the bore of magnet 106 in the MRI apparatus 10. Thus, patient 100 may be selectively positioned within the bore of main magnet 106 and the motion of the table is under computer control along axis 104. Additionally, the system can be designed to allow movement of table 102 laterally as indicated by arrows 108.

In the example of FIG. 2, the pulmonary system 112 of patient 100 is in the iso-center 110 of magnet 106. Monitors 114, 116, and 118 can be placed in close proximity to vessel 120 to monitor the travel of a contrast agent through patient 100, if desired. However, the present invention is not limited to the use of bolus detection and does not require contrast agent, although utilizing contrast enhancement is often desirable. Typically, it is preferred that imaging be performed at the magnet iso-center while the table 102 is translated to allow imaging in the optimal or "sweet spot" of the magnet to reduce image artifacts. The technique of the present invention includes continuously scanning while the table is in translation, but is not so limited.

Figure 3:
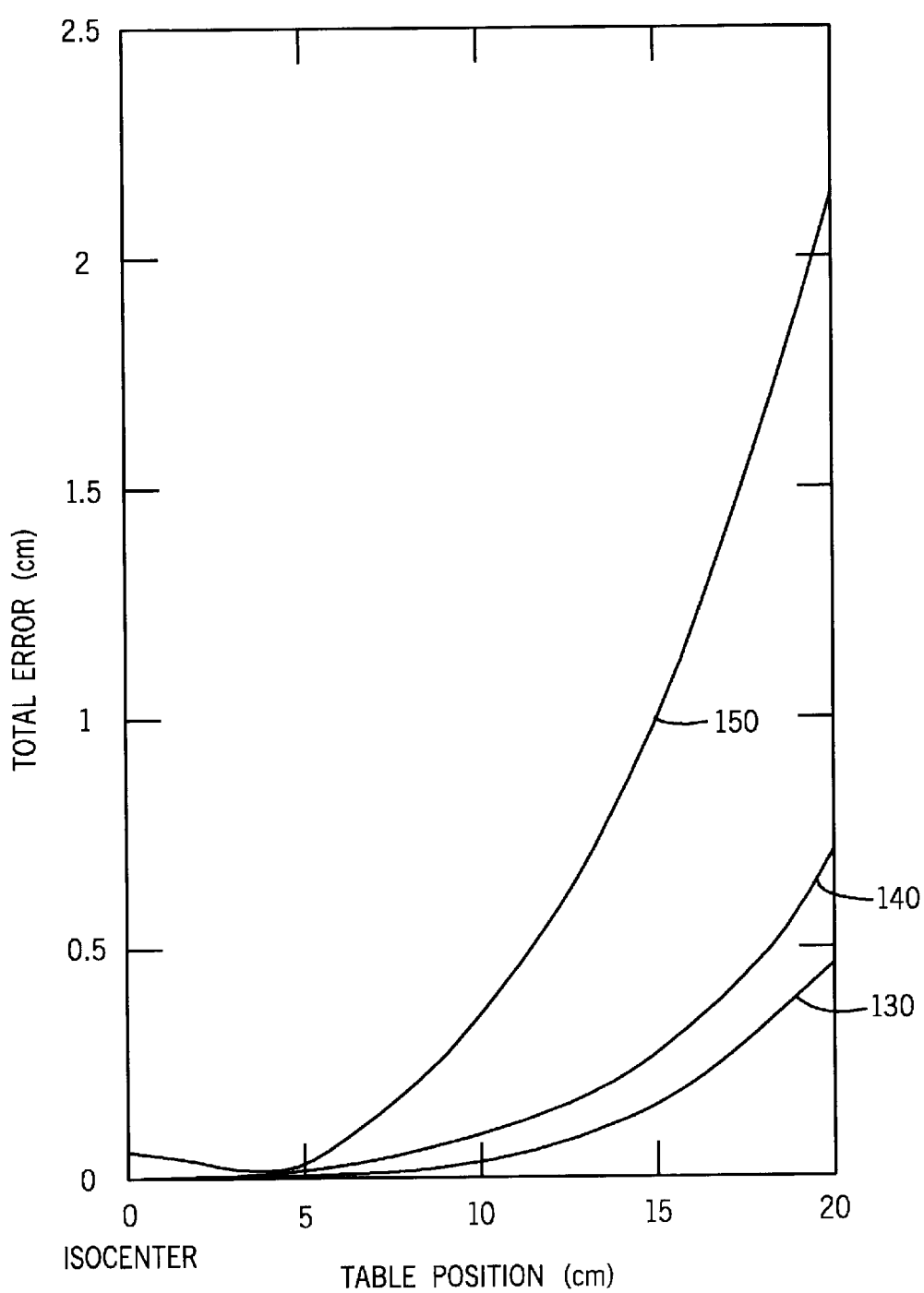
FIG. 3 is a graph showing gradient error versus table position.

The graph of FIG. 3 shows the misregistration errors as a function of table position for three different object locations. The horizontal axis shows table position in centimeters from iso-center (i.e. the z-coordinate) and the vertical axis shows error in centimeters for three different object locations 130, 140, and 150. The first object location 130 has coordinates x=0, y=0 and shows the least amount of positional error as the table moves along the z direction since an object with these coordinates is closest to the iso-center of the magnet. The next object location 140 has coordinates x=1 cm, y=1 cm and has an incrementally increased error. However, as clearly indicated in the graph of FIG. 3, an object location 150 with coordinates x=5 cm, y=5 cm, shows a dramatic increase in positional error resulting from a deviation from linearity as the object location moves further from the magnet iso-center. This error causes blurring and/or ghosting in the resulting images and shows the need for correction.

As previously mentioned, as the table moves during data acquisition, the scanning subject passes through different physical locations in the magnet as it is being imaged. As a result, the subject passes gradient fields that have different amounts of non-linearity as the subject moves from iso-center to the periphery of the gradient field. Since the subject is encoded with different positional errors as it moves through the magnetic field, the resulting images can experience difference degrees of blurring and ghosting depending on the significance of the gradient non-linearity. With moving table MRI, each point in k-space is acquired at a different location in the subject being imaged. However, the physical location in the magnetic field over which the data is acquired is independent of the table position. To correct for gradient non-linearity in the image domain, it is helpful to first define two coordinate systems. The first coordinate system is for the magnet, and the second coordinate system is for the object being imaged and are given by:

$$\vec{r} = \{x,y,z\}$$

$$\vec{r}' = \vec{r} - \vec{p}(t) \quad \text{Eq. 1}$$

where $\vec{p}(t)$ is the position of the object with respect to the magnet as a function of time. For the simplest case with constant velocity along the z direction this reduces to $v_z t$.

The reconstruction process can be generalized to the summation over each k-space point as:

$$\hat{s}(\vec{r}) = \sum_n s(\vec{k}_n) e^{j\vec{k}\cdot\vec{r}} \quad \text{Eq. 2}$$

where $\vec{k}_n$ is the nth k-space point being acquired, and $s(\vec{k}_n)$ is the associated signal value.

By combining Eq. 1 and Eq. 2, a general expression can be formulated for the signal as a function of position in the object being imaged as:

$$\hat{s}(\vec{r}') = \sum_n s(\vec{k}(t_n)) e^{j\vec{k}\cdot\vec{r}'} = \sum_n s(\vec{k}(t_n)) e^{j\vec{k}\cdot\vec{r}} e^{-j\vec{k}\cdot\vec{p}(t_n)}, \quad \text{Eq. 3}$$

where $t_n$ is the time at which k-space point n is acquired. Eq. 3 shows that the reconstruction of the object being imaged can be done by summing over each k-space point with the appropriate Fourier weighting factor and a correction for the distance that the table has traveled.

Applying a warping correction function, such as that commonly referred to as GradWarp, a generalized correction equation can therefore be formulated from Eq. 3. In standard, non-moving table imaging, gradient non-uniformity can be corrected with a procedure referred to as "GradWarp", which is described in detail in commonly assigned U.S. Pat. No. 4,591,789 issued May 27, 1986 to Glover et al., and is applied as described in commonly assigned U.S. Pat. No. 5,642,047, issued Jun. 24, 1997 to Bernstein, both of which are incorporated herein by reference. When the gradients of a magnetic field vary, or are non-uniform, the resulting images can be distorted, or warped. This problem is typically exasperated with increasing distance from the iso-center of the magnet.

Since warping correcting functions are most commonly performed in the physical magnet coordinate system, Eq. 3 can be modified by applying such a correction function to each weighted k-space point prior to correction for table travel and can be given by:

$$\hat{s}_{GW}(\vec{r}') = \sum_n f_{GW}\left(s(\vec{k}(t_n))e^{j\vec{k}\cdot\vec{r}}\right)e^{-j\vec{k}\cdot\vec{p}(t_n)}. \qquad \text{Eq. 4}$$

where $$\sum_n s(\vec{k}(t_n))e^{j\vec{k}\cdot\vec{r}}$$

is a reconstruction summation over each k-space point, $f_{GW}$ is a warp correction function, and $\vec{p}(t)$ is a position of a movable table as a function of time. Eq. 4 is a general solution, but it may also be considered a time intensive solution. That is, for an isotropic 3D data set, a total of $N^3$ GradWarp operations would be required.

A specific implementation of the solution set forth in Eq. 4 is in the case of frequency encoding along the direction of motion in moving table MRI. In such an implementation, it is common to move the table continuously at a constant velocity along the z-direction and frequency encode in the z-direction. In order to perform gradient non-linearity correction in accordance with the present invention for this special case, it is desirable to first determine the amount of data to process. For example, if the table is moving at a relatively fast velocity, or if a slow acquisition sequence is implemented, it may be desirable to process the data on a point-by-point basis. However, if the table is moving at a slower rate, or if a fast sequence is used, then the data may be processed on a line-by-line basis. In order to determine how much data can be processed at a given time, it is necessary to either know the velocity over the course of the scanning, in the case of constant velocity, or continually monitor table motion to determine the velocity. Additionally, a distance that the table travels during readout must be established to avoid blurring. In other words, if a line of data is acquired within this arbitrary distance, then the same distance correction can be made to every point in that line of data. For example, if it is determined that the distance the table travels during the readout of a line of data is less than one pixel, and it is deemed that data acquired with less than one pixel displacement can be treated the same without degradation of image clarity, then the same correction can be applied to all the data in that line of data. For this example, while the table is moving in the presence of frequency encoding, it can be shown that if the velocity is:

$$v < BW \cdot FOV_{freq}/N^2_{freq}, \qquad \text{Eq. 5}$$

where BW is the receiver bandwidth, $FOV_{freq}$ is the frequency-encoding field of view, and $N_{freq}$ is the number of frequency encoding points, then the distance the table travels during the readout is less than one pixel and can be treated the same in terms of motion correction. For example, with a receiver bandwidth of 31.25 kHz, a field of view of 24 cm, and 256 encoding points, the velocity must be less than 11.4 cm/sec.

The problem then reduces to one in which the GradWarp correction can be applied after a Fast Fourier Transform (FFT) has been done along the frequency-encoding (z) direction and the Fourier weighting coefficients have been applied. Eq. 4 can then be modified for the specific case when the table velocity is constant along the z-direction, and 3D data is acquired with frequency encoding along the direction of motion, and is given by:

$$\hat{s}_{GW}(\vec{r}') = \sum_{np}^{NP} f_{GW}\left[\mathcal{F}_z^{-1}\{s(\vec{k}_{mnp})\}e^{j(k_n x + k_p y)}\right] \otimes \delta(z - v_z t_{mnp}). \qquad \text{Eq. 6}$$

where m, n, and p are the indices for the frequency-encoding, phase-encoding, and slice-encoding directions, respectively, and $t_{mnp}$ and $\vec{k}_{mnp}$ the corresponding time and k-space data points according to each point m,n,p. The $\oplus\delta(z-v_z t_{mnp})$ term corresponds to a position shift along the z direction by the amount $v_z t_{mnp}$ where $v_z$ is the table velocity along the z direction.

To implement the method described by Eq. 6, each phase-encoding/slice-encoding step is converted it to an image or volume, depending on whether a 2D or 3D image is being acquired. To do so, the data is first Fourier transformed along the frequency-encoding direction (1-D FFT). Then, additional Fourier transforms are done as needed for each phase encoded data set being processed. This can be done either by applying a Fourier transform to a matrix with all zeros except for the current phase-encoding step, $k_{np}$ or using the basis that $k_{np}$ is a delta function along the phase-encoding direction corresponding to a unique phase modulation, $e^{j(k_n x + k_p y)}$.

The resulting image domain data can then be corrected for gradient distortion using precalculated gradient error maps, which are known in the art. Since the physical location of the acquisition does not change throughout the acquisition, the associated gradient error also remains fixed. Since all the associated GradWarp weighting coefficients can be precalculated, image reconstruction can be performed rapidly. After correction, the data is then shifted by the pixel offset to compensate for table motion and added to the previous data. This process is repeated for each phase-encoding value and across all acquisitions until a final large FOV image is reconstructed.

The amount of distortion is determined by the FOV along the phase encoding directions as well as the "sub" FOV ($FOV_{sub}$) extent along the direction of motion. The "sub" FOV is the distance that the table moves during the acquisition of one complete set of phase-encodings, $FOV_{sub}= v \cdot NP \cdot TR$, where NP is the total number of phase-encoding steps. The total coverage corresponds to $FOV_{tot}=N \cdot FOV_{sub}$ where N is the total number of sub-FOVs or complete acquisitions.

By correcting for gradient non-linearity larger sub-FOVs can be used. As a result, the table-velocity, number of phase-encoding steps, TR, etc. can be increased accordingly. Without correction, the sub-FOV is limited to a much smaller range over which the gradient primarily remains linear resulting in a limited FOV overall.

Figure 4:
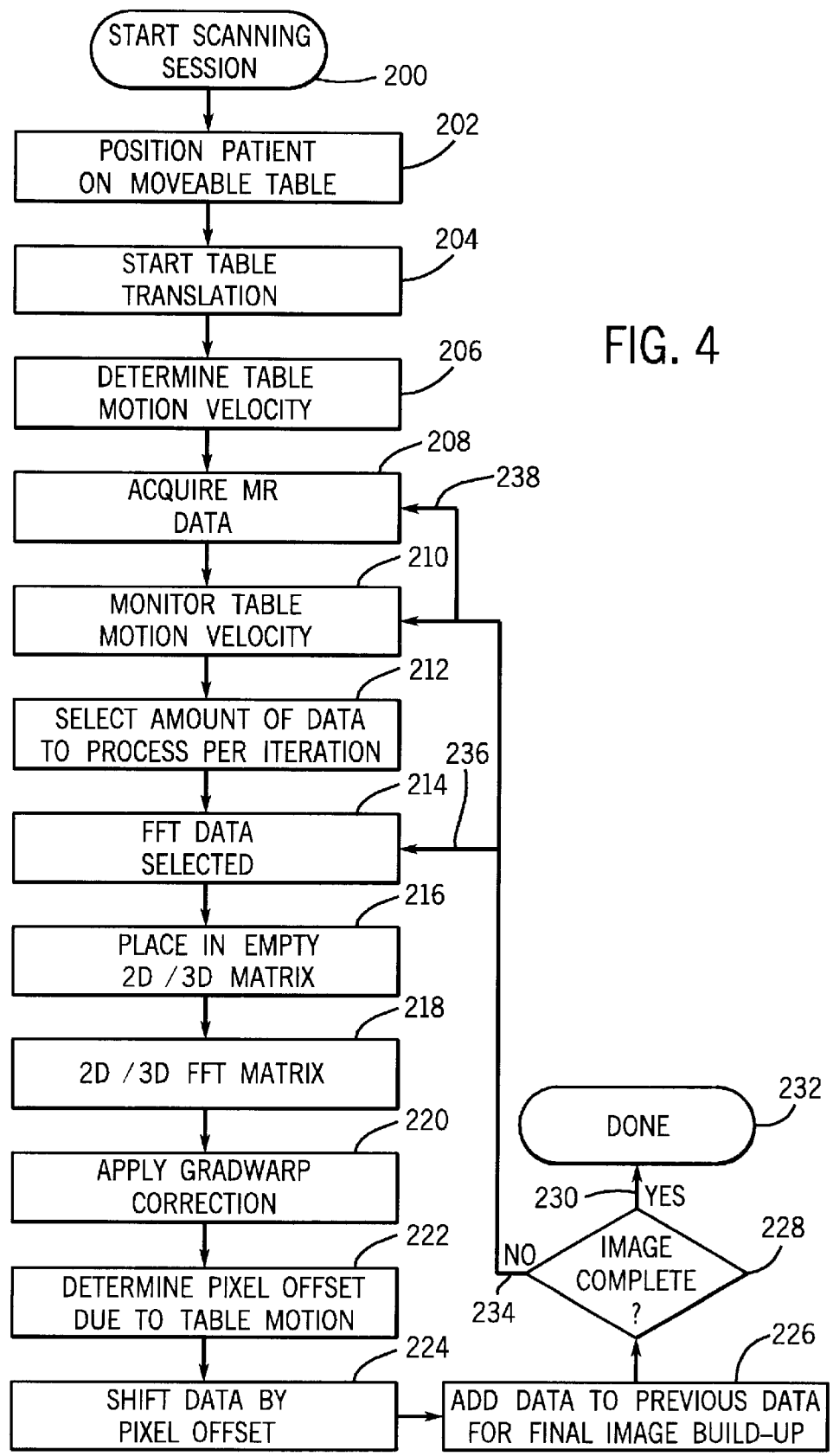
FIG. 4 is a flow chart showing an algorithm for use with the apparatus of FIGS. 1 and 2 to correct gradient non-linearities.

A generalized description of a preferred embodiment implementation of the present technique is set forth in the flow chart of FIG. 4. Once a scanning station is initiated 200, a patient is positioned on the movable table 202, and after the table begins translation 204, an initial determination is made of the table motion velocity 206. MR data is then acquired at 208 and for the case where table motion is not constant, table motion velocity is continually monitored at 210. The present invention is directed towards a reconstruction algorithm that can be implemented either real-time, that is during the acquisition of data, or in post-processing, after all the data is acquired. This flow chart is directed to a real-time reconstruction. However, it is understood that more data may be acquired than can be systematically processed and therefore the acquired data may be stored in a buffer for near real-time reconstruction. Accordingly, the next step is selecting the amount of data to process per iteration at 212. That selected data is then, preferably, Fourier transformed in a direction of table motion 214 and placed into an otherwise empty 2D or 3D matrix 216, depending on the acquisition desired. The matrix is then run through a 2D/3D FFT 218 and then corrected for warping at 220. In a preferred embodiment, the well-known GradWarp function is applied to the data at 220 and then the data is corrected for motion. That is, a pixel offset due to table motion is determined, as previously described, at 222 and the data is appropriately shifted at 224. That shifted data is then added to the previous data at 226 to build up a final image. If the image is complete 228, 230, the scanning session concludes with a single reconstructed image at 232. However, until the image is filled with the desired data 228, 234, another reconstruction iteration begins with monitoring the table motion at 210 and then again selecting the amount of data to process per iteration 212. Alternatively, if the table motion is constant, the reconstruction process can continue via branch 236 to the Fourier transformation 214 since the amount of data to process would then not need to be modified. Also alternatively, should the image reconstruction be performed in real-time, the iteration may resume via branch 238 to acquire additional data at 208. It is noted that even if table motion remains constant, there may be times where the amount of data to process is modified at 212 as in the case where the pulse sequence is modified in real-time during a scanning session.

Figure 5:
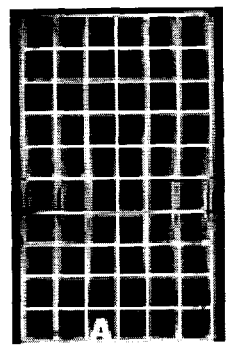
FIGS. 5–8 are representations of a grid phantom demonstrating the results of implementation of the present invention.
Figure 6:
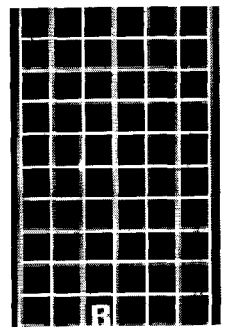
Figure 7:
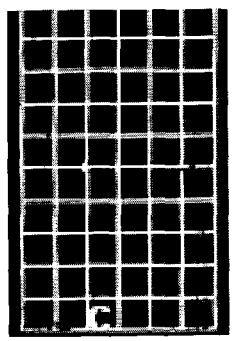
Figure 8:
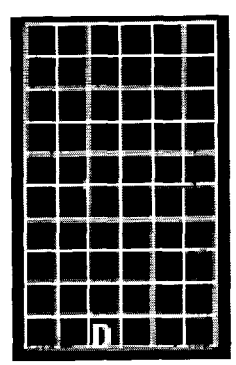

Actual data was collected in a grid phantom using a 1.5 T Lx Scanner from GE Medical Systems, Inc., Milwaukee, Wis. with a spin echo pulse sequence (TE/TR=$14/100$ msec, full echo, FOV=36 cm×36 cm, 10 mm slice thickness, 256×256 matrix). Two different $FOV_{sub}$ were used to demonstrate varying amounts of distortion. In one case, a velocity of 1.28 cm/sec was used corresponding to an $FOV_{sub}$ of 32.6 cm along with N=3 and a scan time of 1:17 min. and is shown in FIG. 5. In another case the velocity was decreased to 0.64 cm/sec corresponding to an $FOV_{sub}$ of 16.3 cm, N=6 and a scan time of 2:34 min and is shown in FIG. 7. For both cases the images were reconstructed with and without correction for gradient distortion. The results shown in FIGS. 5–8 demonstrate the effectiveness of the correction. In FIG. 5 ($FOV_{sub}$=32.6 cm) there is a significant amount of distortion because of the large extent of the $FOV_{sub}$ in the frequency encoding direction. In FIG. 7 ($FOV_{sub}$=16.3 cm) the amount of distortion is significantly reduced, however, there is still some blurring especially towards the edge of the FOV along the phase-encoding direction. FIGS. 6 and 8 show the $FOV_{sub}$=32.6 cm and 16.3 cm after correction for gradient distortion. Both are improved but the larger $FOV_{sub}$ is significantly improved but the smaller FOV shows improvement especially at the edge of the FOV.

Accordingly, by correcting for gradient distortion in accordance with the present invention in moving table scans, larger sub-FOVs can be acquired to enable faster table travel, higher phase-encoding matrix sizes, and/or longer TR times. Although the present invention has been described with reference to correcting motion along the frequency encoding direction, the present invention is not so limited and can be used for motion along any of the encoding directions or even for non-Cartesian sampling techniques. The invention is equally applicable to 2D or 3D imaging. In 3D imaging, correction of each phase encoding/slice encoding step for gradient distortion can be performed.

Accordingly, the present invention includes a method of correcting gradient non-linearities in MR imaging that includes acquiring MR data in motion in the presence of gradient non-linearities, transforming the MR data acquired into an image domain, applying a warping correction to the transformed MR data, and also correcting the warp-corrected MR data for the motion induced during MR data acquisition.

The step of transforming the MR data can include transforming one portion of the MR data, such as line-by-line transformation, or point-by-point transformation, into the image domain. In such an application, the warping correction is then applied to that portion of the MR data, and after correcting that portion of the MR data for motion, that portion of the MR data can be accumulated for final image buildup. The step of acquiring MR data can include acquiring MR data that is affected by a variation of the gradient non-linearities, and correction thereof can be accomplished. The step of acquiring MR data in motion would expectedly include moving table MRI in which the patient is translated through the magnet, but also encompasses a moving magnet, a moving gradient coil, any combination of the aforementioned, including motion of all three major components, or can also include variation in the gradient non-linearities which may be due to current or voltage inconsistencies or other factors.

The present invention also includes a method of correcting gradient non-linearities in moving table MR imaging that includes translating a patient on a movable table within a magnet, acquiring MR data, wherein at least a portion of the MR data is acquired in a presence of gradient non-linearity, and reconstructing the MR data point-by-point into an image. This method also includes correcting any warping in the portion of the MR data that is acquired in the presence of gradient non-linearities while in an image domain and shifting the MR data acquired to compensate for table motion.

This method may also include determining an amount of MR data to process that can be based on table speed, distance traveled, or acquisition sequence applied. In this case, the step of shifting the MR data would include shifting the MR data a fixed amount for the given amount of MR data processed to save processing time without degradation of image quality.

The present invention has been described in terms of the preferred embodiment, and it is recognized that equivalents, alternatives, and modifications, aside from those expressly stated, are possible and within the scope of the appending claims.

What is claimed is:

1. A method of correcting gradient non-linearities in MR imaging comprising:
   acquiring MR data in motion in a presence of gradient non-linearities;
   transforming the MR data acquired into an image domain;
   applying a warping correction to the transformed MR data; and
   correcting the warp-corrected MR data for the motion induced during MR data acquisition.

2. The method of claim 1 wherein the step of transforming the MR data includes transforming one portion of the MR data at a time into the image domain, applying the warping correction to that portion of the MR data, correcting that portion of the MR data for motion, and accumulating the motion corrected MR data in a final image.

3. The method of claim 2 wherein the step of correcting motion includes shifting the MR data by a pixel offset and the step of accumulating includes adding the MR data to any previous MR data corrected to form an image with corrected gradient non-linearity.

4. The method of claim 1 wherein the step of acquiring MR data includes acquiring MR data affected by a variation of the gradient non-linearities.

5. The method of claim 1 wherein the step of acquiring MR data in motion includes at least one of a scanning object moving with respect to a magnet, an object moving with respect to a gradient coil, a magnet moving with respect to an object, a gradient coil moving with respect to an object, a gradient coil and magnet moving with respect to an object, a gradient coil and object moving with respect to a magnet, a magnet and object moving with respect to a gradient coil, and a moving magnet, gradient coil, and object.

6. The method of claim 1 wherein the step of transforming MR data includes Fourier transforming each data point, point by point.

7. The method of claim 1 wherein the step of transforming MR data includes Fourier transforming each k-space line of data to the image domain.

8. The method of claim 1 wherein the motion is induced by a moving table with respect to a bore of a magnet.

9. The method of claim 8 wherein the step of acquiring MR data includes acquiring MR data that is frequency encoded in a direction of motion and the step of transforming MR data includes applying a 1-D FFT and placing the 1-D FFT transformed data into an otherwise empty 2D/3D matrix and then applying further Fourier transform along any other directions.

10. The method of claim 9 wherein the gradient error is calculated according to:

$$\hat{s}_{GW}(\vec{r}') = \sum_n f_{GW}\left(s(\vec{k}(t_n))e^{j\vec{k}\cdot\vec{r}}\right)e^{-j\vec{k}\cdot\vec{p}(t_n)}$$

where $$\sum_n s(\vec{k}(t_n))e^{j\vec{k}\cdot\vec{r}}$$

is a reconstruction summation over each k-space point, $f_{GW}$ is a warp correction function, and $\vec{p}(t)$ is a position of a movable table as a function of time.

11. The method of claim 1 wherein the warping correction is a precalculated gradient error calculation.

12. A method of correcting gradient non-linearities in moving table MR imaging comprising the steps of:
   translating a patient on a movable table within a magnet;
   acquiring MR data in a presence of gradient non-linearity;
   reconstructing a portion of the MR data into an image;
   correcting any warping in the portion of the MR data that is acquired in the presence of gradient non-linearity while in an image domain; and
   shifting the MR data acquired and reconstructed to compensate for table motion.

13. The method of claim 12 further comprising determining an amount of MR data to process and wherein the step of shifting the MR data includes shifting the MR data a fixed amount for a given amount of MR data processed.

14. The method of claim 13 wherein the step of determining an amount of MR data to process is based on table speed, distance traveled, and an acquisition sequence applied.

15. The method of claim 13 further comprising the step of adding the MR data to previously acquired MR data for a given FOV.

16. The method of claim 13 wherein a predefined distance is established, based on table velocity and an acquisition sequence applied, for determining the shifting needed to avoid image blurring.

17. The method of claim 16 wherein the predefined distance is given by:

$$D = \frac{BW \cdot FOV_{freq} \cdot \tau}{N_{freq}^2}$$

where BW is receiver bandwidth, $FOV_{freq}$ is a frequency-encoding field-of-view, $N_{freq}$ is a number of frequency encoding points, and $\tau$ is a time of travel calculated from the table velocity.

18. The method of claim 12 wherein the amount of MR data to process at a given time is determined at least partially on table velocity so that the amount of MR data processed can be shifted an equal amount.

19. The method of claim 12 wherein the step of reconstructing includes first Fourier transforming in a direction of table motion, then applying a 2D/3D Fourier transform.

20. The method of claim 19 further comprising placing the first Fourier transformed MR data in an otherwise empty matrix to then apply the 2D/3D Fourier transform thereto.

21. The method of claim 12 wherein the step of correcting any warping is only performed on MR data that is acquired in the presence of gradient non-linearity.

22. The method of claim 12 wherein the step of correcting any warping is performed with a GradWarp function.

23. The method of claim 12 wherein the step of correcting any warping is performed with a pre-existing gradient error map.

24. The method of claim 12 further comprising the step of monitoring table motion while acquiring MR data.

25. The method of claim 12 wherein the MR data is processed by one of line-by-line and point-by-point.

26. An MR apparatus having gradient non-linearity compensation for moving objects comprising:
   a magnetic resonance imaging system having a plurality of gradient coils positioned about a bore of a magnet to impress a polarizing magnetic field and an RF transceiver system and an RF switch controlled by a pulse module to transmit RF signals to an RF coil assembly to acquire MR images;

a movable table to translate an imaging object about the magnet; and a computer programmed to:

translate the moving table through the bore of the magnet;

acquire MR data of an imaging object positioned on the moving table as the movable table is translated through the bore of the magnet;

process the MR data acquired by one of point-by-point and line-by-line;

perform a 1-D FT on the MR data in a direction of table motion;

perform at least one additional FT on the MR data;

apply a GradWrap function on the MR data; and fill an image space with the MR data.

27. The apparatus of claim 26 wherein the computer is further programmed to correct the MR data for motion after application of the GradWarp function.

28. The apparatus of claim 26 wherein the image is filled by adding the MR data to build up an image after application of the GradWarp function.

29. The apparatus of claim 26 wherein the GradWarp function uses a predetermined error map of gradient non-linearities.

30. The apparatus of claim 26 wherein the computer is further programmed to determine an amount of MR data to process and shift the MR data a fixed amount for a given amount of MR data processed.

31. A computer program for compensating for gradient non-linearities in moving table MR imaging, the computer program comprising a set of instructions to cause a computer to:

move a patient table with respect to a gradient coil;

acquire a plurality of MR data points;

place at least one MR data point into a matrix sized based on a desired image dimension sought wherein a remainder of the matrix has zeros therein;

perform an FFT, a type of which is based on the desired image dimension sought, to each MR data point;

apply a GradWrap function to the MR data points;

correct each MR data point for patient table motion; and add each MR data point to build up an image.

32. The computer program of claim 31 wherein the MR data acquired is affected by gradient variations.

33. The computer program of claim 31 wherein the step of correcting for patient table motion includes finding a pixel offset based on motion velocity and shifting the MR data point by the pixel offset.

34. The computer program of claim 31 wherein the GradWarp function uses a predetermined error map of gradient non-linearity coefficients.

35. The computer program of claim 31 wherein a gradient error is calculated according to:

$$\hat{s}_{GW}(\vec{r}') = \sum_n f_{GW}\left(s(\vec{k}(t_n))e^{j\vec{k}\cdot\vec{r}}\right)e^{-j\vec{k}\vec{p}(t_n)}$$

where $$\sum_n s(\vec{k}(t_n))e^{j\vec{k}\cdot\vec{r}}$$

is a reconstruction summation over each k-space point, $f_{GW}$ is a warp correction function, and $\vec{p}(t)$ is a position of a movable table as a function of time.

* * * * *

UNITED STATES PATENT AND TRADEMARK OFFICE
CERTIFICATE OF CORRECTION

PATENT NO. : 6,707,300 B2
DATED : March 16, 2004
INVENTOR(S) : Polzin et al.

It is certified that error appears in the above-identified patent and that said Letters Patent is hereby corrected as shown below:

Column 11,
Line 53, delete "$\hat{s}_{GW}(\vec{r}') = \sum_{n} f_{GW}\left(s(\vec{k}(t_n))e^{j\vec{k}\cdot\vec{r}}\right)e^{-j\vec{k}\vec{p}(t_n)}$" and substitute therefor -- $\hat{s}_{GW}(\vec{r}') = \sum_{n} f_{GW}\left(s(\vec{k}(t_n))e^{j\vec{k}\cdot\vec{r}}\right)e^{-j\vec{k}\cdot\vec{p}(t_n)}$ --.

Column 12,
Line 30, delete "$D = \dfrac{BW \cdot FOV_{freq} \cdot \tau}{N^2_{freq}}$" and substitute therefor -- $D = \dfrac{BW \cdot FOV_{freq} \cdot \tau}{N^2_{freq}}$ --;

Column 14,
Line 22, delete "$\hat{s}_{GW}(\vec{r}') = \sum_{n} f_{GW}\left(s(\vec{k}(t_n))e^{j\vec{k}\cdot\vec{r}}\right)e^{-j\vec{k}\vec{p}(t_n)}$" and substitute therefor -- $\hat{s}_{GW}(\vec{r}') = \sum_{n} f_{GW}\left(s(\vec{k}(t_n))e^{j\vec{k}\cdot\vec{r}}\right)e^{-j\vec{k}\cdot\vec{p}(t_n)}$ --.

Signed and Sealed this

Fourteenth Day of September, 2004

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,707,300 B2 | Page 1 of 1 |
| APPLICATION NO. | : 10/147701 | |
| DATED | : March 16, 2004 | |
| INVENTOR(S) | : Polzin et al. | |

It is certified that error appears in the above-identified patent and that said Letters Patent is hereby corrected as shown below:

Col. 1, line 3, insert the following statement:

GOVERNMENT LICENSE RIGHTS

The U.S. Government has a paid-up license in this invention and the right in limited circumstances to require the patent owner to license others on reasonable terms as provided for by the terms of Contract No. CA037993 awarded by the National Institute of Health.

Signed and Sealed this

First Day of August, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,707,300 C1 | |
| APPLICATION NO. | : 90/008056 | |
| DATED | : July 21, 2009 | |
| INVENTOR(S) | : Polzin et al. | |

It is certified that error appears in the above-identified patent and that said Letters Patent is hereby corrected as shown below:

Title Page, Item (73), add as the first Assignee: "General Electric Company, Schenectady, NY (US);".

Signed and Sealed this
Seventeenth Day of May, 2011

David J. Kappos
*Director of the United States Patent and Trademark Office*

US006707300C1

(12) EX PARTE REEXAMINATION CERTIFICATE (6953rd)

United States Patent
Polzin et al.

(10) Number: US 6,707,300 C1
(45) Certificate Issued: Jul. 21, 2009

(54) GRADIENT NON-LINEARITY COMPENSATION IN MOVING TABLE MRI

(75) Inventors: Jason A. Polzin, Lake Mills, WI (US); Stephen J. Riederer, Rochester, MN (US); David G. Kruger, Nelson, WI (US)

(73) Assignee: Mayo Foundation for Medical Education and Research, Rochester, MN (US)

Reexamination Request:
No. 90/008,056, Jun. 26, 2006

Reexamination Certificate for:
Patent No.: 6,707,300
Issued: Mar. 16, 2004
Appl. No.: 10/147,701
Filed: May 17, 2002

Certificate of Correction issued Sep. 14, 2004.

Certificate of Correction issued Aug. 1, 2006.

(51) Int. Cl.
*G01R 33/54* (2006.01)
*G01R 33/563* (2006.01)
*G01R 33/565* (2006.01)

(52) U.S. Cl. .................................... 324/309; 324/307
(58) Field of Classification Search ........................ None
See application file for complete search history.

(56) References Cited

U.S. PATENT DOCUMENTS 4,591,789 A    5/1986  Glover et al.
5,642,047 A *  6/1997  Bernstein ............... 324/309

FOREIGN PATENT DOCUMENTS

EP          1024371 A       8/2000
WO     WO 0302701 A1 *      4/2003
WO        03/27701 A        4/2003

OTHER PUBLICATIONS

J. A. Polzin et al., "Correction for Gradient Field Distortions in Moving Table Imaging" Proc. Intl. Soc. Mag. Reson. Med., p. 10, 2002.

Kruger D. G. et al. "Continuously Moving Table Data Acquisition method for long FOV contrast–enhanced MRA and whole–body MRI" Magnetic Resonance in Medicine 47:pp. 224–231 (2002).

Various pages from the website of the International Society for Magnetic Resonance in Medicine, www.ismrm.org, pp. 1–17.

\* cited by examiner

*Primary Examiner*—Deandra M Hughes

(57) ABSTRACT

The present invention includes a method and apparatus to correct for gradient field distortions. The invention is particularly applicable in moving table imaging where a single extended image is desirable. The invention includes acquiring MR data in motion in the presence of gradient non-linearities, transforming the MR data acquired into the image domain, and then applying a warping correction function to the transformed MR data. The warp-corrected MR data is then corrected for motion induced during the MR acquisition. The data may be acquired point-by-point, line-by-line, or another sub-portion of the entire MR data acquired, and processed to minimize the amount of motion correction needed. Based on table velocity or acquisition sequence applied, the data is partitioned based on a common motion correction factor, and after correcting for motion, the data is accumulated to build up a final image.

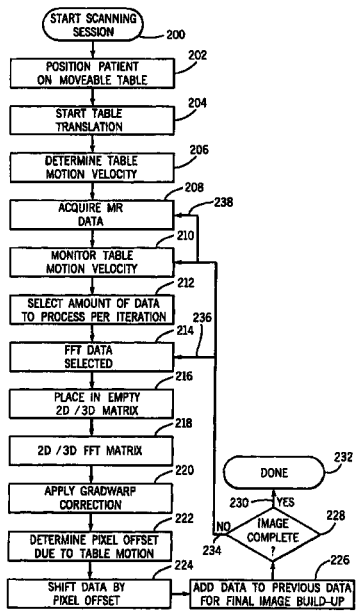

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 12, 26 and 31 are determined to be patentable as amended.

Claims 2–11, 13–25, 27–30 and 32–35, dependent on an amended claim, are determined to be patentable.

1. A method of correcting gradient non-linearities in MR imaging comprising:
   acquiring MR data in motion in a presence of gradient non-linearities *produced by gradient coils in an MR apparatus*;
   transforming the MR data acquired into an image domain;
   applying a warping correction to the transformed MR data; and
   correcting the warp-corrected MR data for the motion induced during MR data acquisition.

12. A method of correcting gradient non-linearities in moving table MR imaging comprising the steps of:
   translating a patient on a movable table within a magnet *of an MR apparatus*;
   acquiring MR data in a presence of gradient non-linearity;
   reconstructing a portion of the MR data into an image;
   correcting any warping in the portion of the MR data that is acquired in the presence of gradient non-linearity while in an image domain; and
   shifting the MR data acquired and reconstructed to compensate for table motion.

26. An MR apparatus having gradient non-linearity compensation for moving objects comprising:
   a magnetic resonance imaging system having a plurality of gradient coils positioned about a bore of a magnet to impress a polarizing magnetic field and an RF transceiver system and an RF switch controlled by a pulse module to transmit RF signals to an RF coil assembly to acquire MR images;
   a movable table to translate an imaging object about the magnet; and
   a computer programmed to:
      translate the moving table through the bore of the magnet;
      acquire MR data of an imaging object positioned on the moving table as the movable table is translated through the bore of the magnet;
      process the MR data acquired by one point-by-point and line-by-line;
      perform a 1-D FT on the MR data in a direction of table motion;
      perform at least one additional FT on the MR data;
      apply a [GradWrap] *GradWarp* function on the MR data; and
      fill an image space with the MR data.

31. A *computer readable storage medium having stored thereon a* computer program for compensating for gradient non-linearities in moving table MR imaging, the computer program comprising a set of instructions to cause a computer to:
   move a patient table with respect to a gradient coil;
   acquire a plurality of MR data points;
   place at least one MR data point into a matrix sized based on a desired image dimension sought wherein a remainder of the matrix has zeros therein;
   perform an FFT, a type of which is based on the desired image dimension sought, to each MR data point;
   apply a [GradWrap] *GradWarp* function to the MR data points *having the FFT performed thereto*;
   correct each MR data point *having the GradWarp function applied thereto* for patient table motion; and
   add each *corrected* MR data point to build up an image.

* * * * *